United States Patent [19]
Michael et al.

[11] Patent Number: 5,792,706
[45] Date of Patent: Aug. 11, 1998

[54] INTERLEVEL DIELECTRIC WITH AIR GAPS TO REDUCE PERMITIVITY

[75] Inventors: Mark W. Michael, Cedar Park; Robert Dawson, Austin; Fred N. Hause, Austin; Basab Bandyopadhyay, Austin; H. Jim Fulford, Jr., Austin; William S. Brennan, Austin, all of Tex.

[73] Assignee: Advanced Micro Devices, Inc., Sunnyvale, Calif.

[21] Appl. No.: 658,457

[22] Filed: Jun. 5, 1996

[51] Int. Cl.$^6$ ............................... H01L 21/31
[52] U.S. Cl. ............... 438/626; 438/700; 438/723
[58] Field of Search .................. 437/195, 228, 437/235, 236, 238, 927; 438/626, 619, 631, 669, 700, 723, 699

[56] References Cited

U.S. PATENT DOCUMENTS 5,407,860  4/1995  Stoltz et al. ........................ 437/180
5,559,055  9/1996  Chang et al. ........................ 437/195

OTHER PUBLICATIONS

S. Wolf, "Silicon Processing for the VLSI Era" vol. 2 (1990) Lattice Press, Calif. p. 198.

*Primary Examiner*—Caridad Everhart
*Attorney, Agent, or Firm*—Kevin L. Daffer; Conley, Rose & Tayon

[57] ABSTRACT

A reduced permittivity interlevel dielectric is provided. The interlevel dielectric is formed between two levels of interconnect. The interlevel dielectric comprises a first dielectric layer formed from a TEOS source deposited on a first level interconnect. The first dielectric contains air gaps at spaced intervals across the first dielectric. A second dielectric, preferably from a silane source is deposited upon said first dielectric. A second interconnect level is then placed on the second dielectric.

20 Claims, 7 Drawing Sheets

INTERLEVEL DIELECTRIC WITH AIR GAPS TO REDUCE PERMITTIVITY

BACKGROUND OF THE INVENTION

1. Field of the Invention

This invention relates to semiconductor fabrication and more particularly to a dielectric material having air gaps formed between semiconductor interconnect lines on the same or on different levels. Void of dielectric, the air gaps decrease the overall permittivity of the interlevel or interlayer dielectric.

2. Description of the Relevant Art

An integrated circuit includes numerous conductors extending across the topography of a monolithic substrate. A set of interconnect lines (or conductors) which serve to electrically connect two or more components within a system is generally referred to as a "bus". A collection of voltage levels are forwarded across the conductors to allow proper operation of the components. For example, a microprocessor is connected to memories and input/output devices by certain bus structures. There are numerous types of busses which are classified according to their operation. Examples of well-known types of busses include address busses, data busses and control busses.

Conductors within a bus generally extend parallel to each other across the semiconductor topography. The conductors are isolated from each other and from underlying conductive elements by a dielectric, a suitable dielectric being, for example, silicon dioxide ("oxide"). Conductors are thereby lithography patterned across the semiconductor topography, wherein the topography comprises a substrate with a dielectric placed thereon. The topography can also include one or more layers of conductors which are sealed by an upper layer of dielectric material. Accordingly, the layers of conductors overlaid with a dielectric present a topography upon which a subsequent layer of conductors can be patterned.

Conductors are made from an electrically conductive material, a suitable material includes Al, Ti, Ta, W, Mo, polysilicon, or a combination thereof. The substrate includes any type of material which can retain dopant ions and the isolated conductivity regions brought about by those ions. Typically, substrate is a silicon-based material which receives p-type or n-type ions.

Generally speaking, interconnect lines (or conductors) are fashioned upon the topography and spaced above an underlying conductor or substrate by a dielectric of thickness $T_{d1}$. Each conductor is dielectrically spaced from other conductors within the same level of conductors by a distance $T_{d2}$. Accordingly, interlevel capacitance $C_{LS}$ (i.e., capacitance between conductors on different levels) is determined as follows:

$$C_{LS} = \epsilon W_L L / T_{d1} \qquad \text{(Eq. 1)}$$

Further, the intralevel capacitance $C_{LL}$ (i.e., capacitance between conductors on the same level) is determined as follows:

$$C_{LL} = \epsilon T_C L / T_{d2} \qquad \text{(Eq. 2)}$$

where $\epsilon$ is the permittivity of the dielectric material (the dielectric material between the conductor and substrate or the dielectric material between conductors), $W_L$ is the conductor width, $T_C$ is the conductor thickness, and L is the conductor length. Resistance of the conductor is calculated as follows:

$$R = (\rho L)/W_L T_c \qquad \text{(Eq. 3)}$$

, where $\rho$ represents resistivity of the conductive material, and $T_c$, is the interconnect thickness. Combinations of equations 1 and 3, and/or equations 2 and 3 indicate the propagation delay of a conductor as follows:

$$RC_{LS} = \rho \epsilon L^2 / T_c T_{d1}$$

$$RC_{LL} = \rho \epsilon L^2 / W_L T_{d2} \qquad \text{(Eq. 4)}$$

Propagation delay is an important characteristic of an integrated circuit since it limits the speed (frequency) at which the circuit or circuits can operate. The shorter the propagation delay, the higher the speed of the circuit orcircuits. It is therefore important that propagation delay be minimized as much as possible within the geometric constraints of the semiconductor topography.

Equation 4 shows that the propagation delay of a circuit is determined by parasitic capacitance values ($C_{LL}$) between laterally spaced conductors, and parasitic capacitance values ($C_{LS}$) between vertically spaced conductors or between a conductor and the underlying substrate. As circuit density increases, lateral spacing and vertical spacing between conductors decrease and capacitance $C_{LL}$ increases. Meanwhile, planarization mandates to some extent a decrease in vertical spacing. Shallow trench processing, recessed LOCOS processing, and multi-layered interlevel dielectrics bring about an overall reduction in vertical spacing and therefore an increase in $C_{LS}$. Integrated circuits which employ narrow interconnect spacings thereby define $C_{LL}$ as a predominant capacitance, and integrated circuits which employ thin interlevel dielectrics define $C_{LS}$ as a predominant capacitance.

It is therefore important to minimize propagation delay especially in critical speed path. Given the constraints of chemical compositions, it is not readily plausible to reduce the resistivity $\rho$ of conductor materials. Geometric constraints make it difficult to increase conductor thickness $T_c$ or dielectric thickness $T_{d1}$ or $T_{d2}$. Still further, instead of reducing length L of a conductor, most modern integrated circuits employ long interconnect lines which compound the propagation delay problems. Accordingly, a need arises for instituting a reduction in propagation delay but within the chemical and geometric constraints of existing fabrication processes. It is therefore desirable that a fabrication process be derived which can reduce propagation by reducing the permittivity $\epsilon$ of dielectric material. More specifically, the desired process must be one which reduces permittivity of dielectric material arranged between horizontally displaced or vertically displaced conductors. As such, it would be desirable to employ a fabrication technique in which dielectrics between conductors achieve low permittivity.

SUMMARY OF THE INVENTION

The problems outlined above are in large part addressed by a dielectric fabrication process that produces a low permittivity between the interconnect lines arranged substantially coplanar to each other without the same elevation level ("intralevel permittivity") and between interconnect lines within two separate planes or levels ("interlevel permittivity"). A layer of conductive material which forms a first interconnect level comprising aluminum is deposited on a wafer topography and then plasma etched. Next, a first dielectric is formed on the first interconnect level. Preferably the first dielectric comprises $SiO_2$ formed from a TEOS source in a plasma enhanced chemical vapor deposition chamber at approximately 375° C. Portions of the first dielectric layer are then removed, preferably in a plasma etch, at spaced intervals across the first dielectric layer. Because the permittivity of air is less than the permittivity of a semiconductor dielectric, formation of trenches within the first dielectric reduces propagation delay and proves beneficial in meeting speed requirements within critical path interconnect lines, possibly interconnect lines spaced adjacent each other within a bus structure.

In one embodiment, the trenches extend to a first distance from the semiconductor topography where the first distance is greater than the height of the first interconnect lines. Trenches formed in this embodiment do not extend between the interconnect lines of the first dielectric. While this embodiment does not substantially alter the intralevel permittivity, it does reduce interlevel permittivity and may simplify the generation of the trench mask. In another embodiment, the trenches extend to a distance less than the height of the first interconnect. Trenches thusly formed may extend fully to the semiconductor topography between the interconnect lines of the first interconnect. If the trenches extend between the interconnect lines, they serve to reduce intralevel permittivity as well as interlevel permittivity. This embodiment can be further modified such that trenches are formed a minimum lateral displacement from the interconnect lines of the first interconnect.

After trenches are formed in the first dielectric, a capping dielectric layer is then placed onto the first dielectric and across openings of the trenches. The capping dielectric preferably comprises a silane based CVD oxide deposited within a chamber maintained approximately at or somewhat below the atmospheric pressure. Deposition of the capping oxide under these conditions facilitates cusping of the capping dielectric. Coupled with the aspect ratios of the trenches, which are generally greater than 1.0, the cusping of the capping dielectric results in a dielectric layer that covers the trench opening without filling the trench with dielectric.

Broadly speaking, the present invention contemplates a multi-layered dielectric formed between a pair of integrated circuit interconnects. A first layer of metal material is deposited upon a semiconductor topography. Thereafter, portions of the layer of metal are removed to form a spaced set of first conductors. A first dielectric is then deposited on the first conductors. Preferably the first dielectric comprises $SiO_2$ formed from a TEOS source in a plasma enhanced chemical vapor deposition chamber at approximately 375° C.

Portions of the first dielectric are then removed at spaced intervals across the dielectric to form trenches. Removal of the first dielectric is preferably accomplished with a plasma etch process. In one embodiment, the trenches extend to a first distance above the semiconductor topography wherein the first distance is greater than the height of the first interconnect. In another embodiment, the trenches extend to the semiconductor topography.

A capping dielectric is next deposited on the first dielectric. The capping dielectric is preferably formed from a silane source in a CVD reactor chamber maintained approximately at or slightly below atmospheric pressure. After deposition of the capping dielectric, a second layer of interconnect is then formed on the capping dielectric. In one embodiment, the method also includes the step of forming contact openings through the capping dielectric and first dielectric to at least one of the first level of interconnects. In one embodiment, the method further includes laterally spacing the contact openings from the trenches.

The present invention further contemplates an interlevel dielectric structure. The dielectric structure comprises a plurality of trenches spaced from each other across a first dielectric configured upon and between a set of substantially coplanar first conductors. A second dielectric is formed on the trenches. Upon this second dielectric, a set of substantially coplanar second conductors is formed.

BRIEF DESCRIPTION OF THE DRAWINGS

Other objects and advantages of the invention will become apparent upon reading the following detailed description and upon reference to the accompanying drawings in which.

Figure 1:
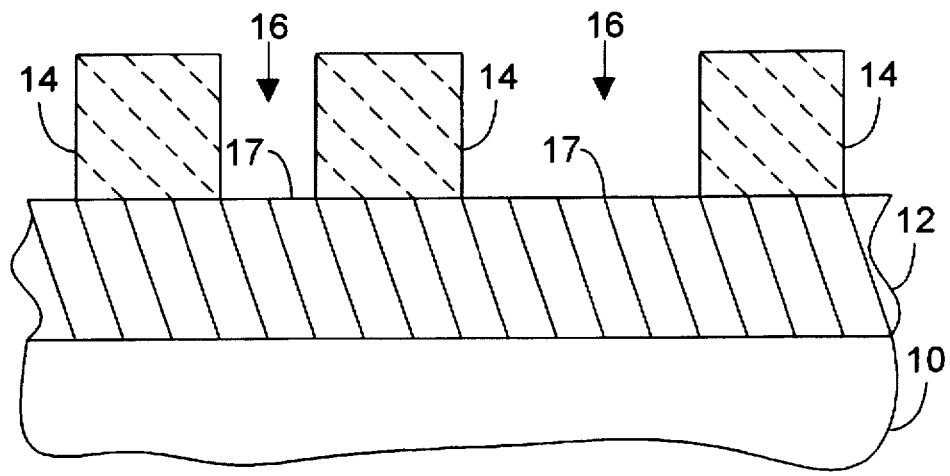
FIG. 1 is a partial cross-sectional view of a semiconductor topography having a first layer of metal and a patterned photoresist placed thereon.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 shows a first level of interconnect 12 formed upon semiconductor topography 10 and photoresist layer 14 formed upon interconnect 12. First interconnect level 12 is preferably formed by a physical vapor deposition (PVD) process using an aluminum target or by CVD from a metal-organic precursor. Openings 16 have been patterned in photoresist 14 with a photo-lithography step using a first interconnect mask having a pattern. After openings 16 have been created in photoresist layer 14, exposed interconnect 17 is then removed in an interconnect etch process.

Figure 2:
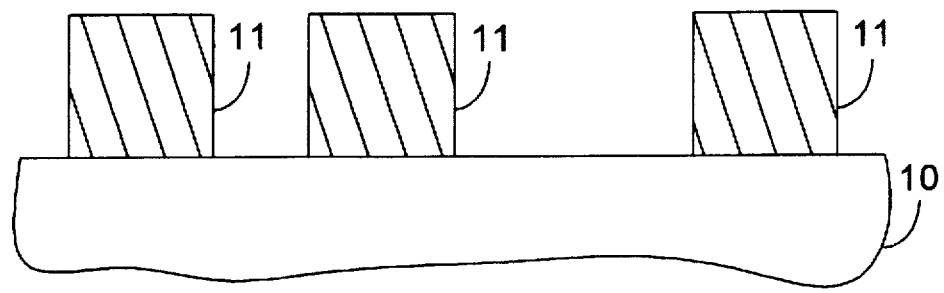
FIG. 2 is a processing step subsequent to that shown in FIG. 1, in which portions of the first level of metal have been removed.

FIG. 2 depicts first interconnect level 12 after the exposed interconnect level areas 17 have been removed leaving first interconnect lines 11 (i.e., substantially coplanar first conductors 11). Removal of exposed interconnect area 17 is preferably accomplished by a plasma etch that incorporates a $BCl_3$ species and another Cl containing species such as Cl or HCl to achieve an anisotropic etch. It is believed that the incorporation of a polymer-forming chemistry such as $CF_4$ or $CHF_3$ into the interconnect etch process facilitates an anisotropic etch by forming inhibiting or passivating layers on the interconnect surface. These passivating layers are removed on the interconnect surfaces that are struck by energetic ions thereby allowing etch of the exposed interconnect in those regions. On the interconnect surfaces that are not struck by energetic ions however, the passivating layers are not removed and no etch results.

It is further believed that since the energetic ions tend to strike the wafer perpendicular to the wafer surface, the interconnect etch proceeds anisotropically because the passivating layers are removed on the surfaces parallel to wafer topography 10, while surfaces perpendicular to wafer topography 10 (i.e. the sidewalls) remain unetched because few energetic ions capable of removing the passivating layer strike these surfaces. The creation of passivating sidewalls during an interconnect etch process is desirable because the passivating sidewalls result in an anisotropic etch and a perpendicular metal profile. Perpendicular profiles are desirable because the perpendicular profile maximizes the cross-sectional area of the interconnect thereby reducing the current density and packing density.

Figure 3:
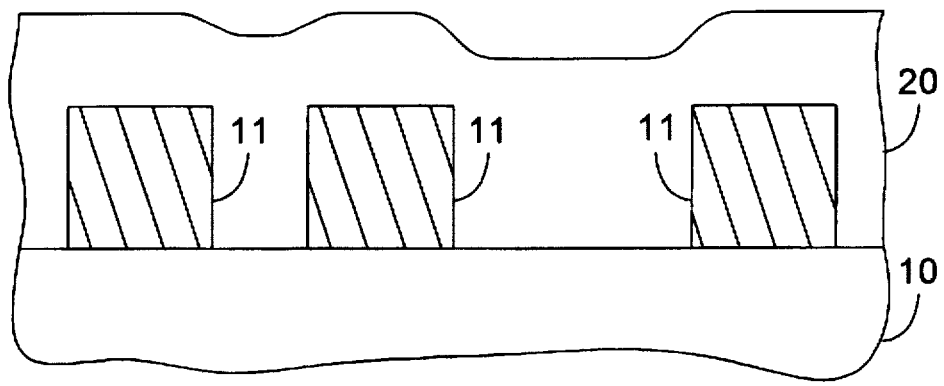
FIG. 3 is a processing step subsequent to that shown in FIG. 2, wherein a first dielectric is partially formed upon the first level of metal.

FIG. 3 depicts a subsequent processing step wherein first dielectric layer 20 has been partially formed on first interconnect level 12 and wafer topography 10. First dielectric 20 is preferably formed in a plasma enhanced CVD reactor with a TEOS source at a temperature of approximately 375° C. The use of a TEOS source for the first dielectric is preferable because the high surface mobility of organic silicon compound adatoms are believed to result in improved step coverage and conformality. TEOS based oxides are better able to fill spaces between adjacent lines 11 than silane based oxides. Silane based oxides tend to leave voids when used to fill spaces having aspect ratios greater than 0.5. The aspect ratio of a feature is defined, for purposes herein, as the vertical dimension of a fill area divided by the horizontal dimension of that area.

Figure 4:
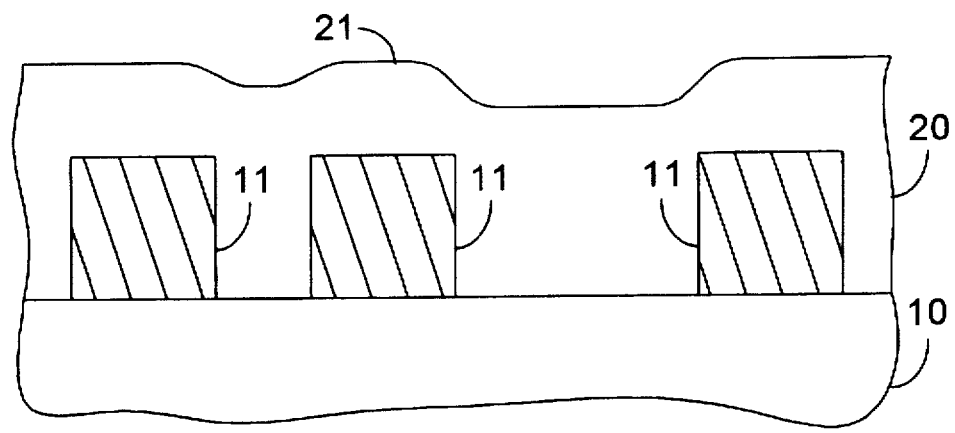
FIG. 4 is a processing step subsequent to that shown in FIG. 3, wherein the first dielectric is completed upon the first dielectric.

To produce a substantially planar upper surface of dielectric 20, a number of techniques may be employed. In one embodiment, dielectric 20 is deposited in two or more stages wherein each deposition is followed by a planarization step. Any of a number of techniques may be used to planarize dielectric 20 including selective etchback, and chemical mechanical polishing. FIGS. 3 and 4 of the drawings disclose an exemplary two stage process for forming first dielectric 20. If desired, each deposition stage may be followed by a chemical mechanical polish. After the second stage deposition and planarization, a substantially planar upper surface 21 of first dielectric 20 is produced.

Figure 5:
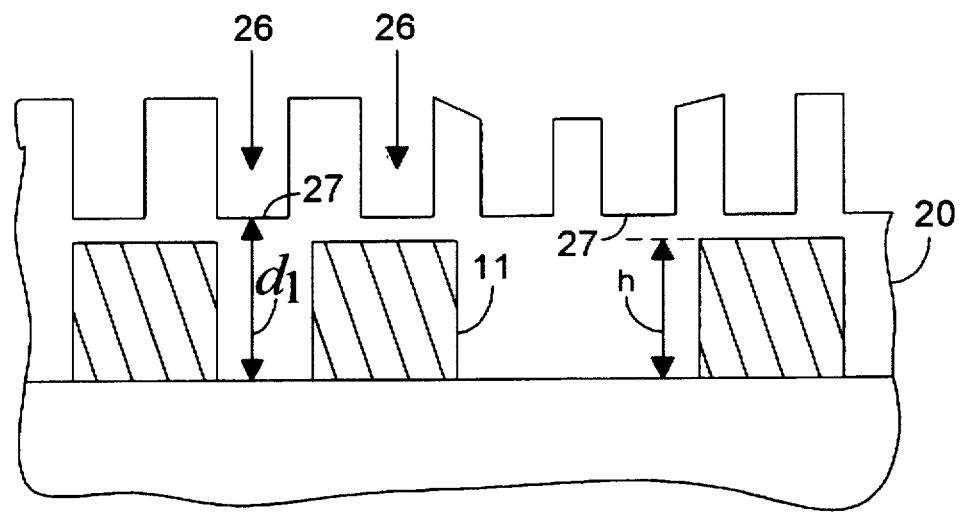
FIG. 5 is a processing step subsequent to that shown in FIG. 4, wherein portions of the second layer of dielectric have been removed at spaced intervals across the first dielectric to form high aspect ratio trenches wherein the trench depth does not extend below the upper surface of the first interconnect a/c to one exemplary embodiment.
Figure 6:
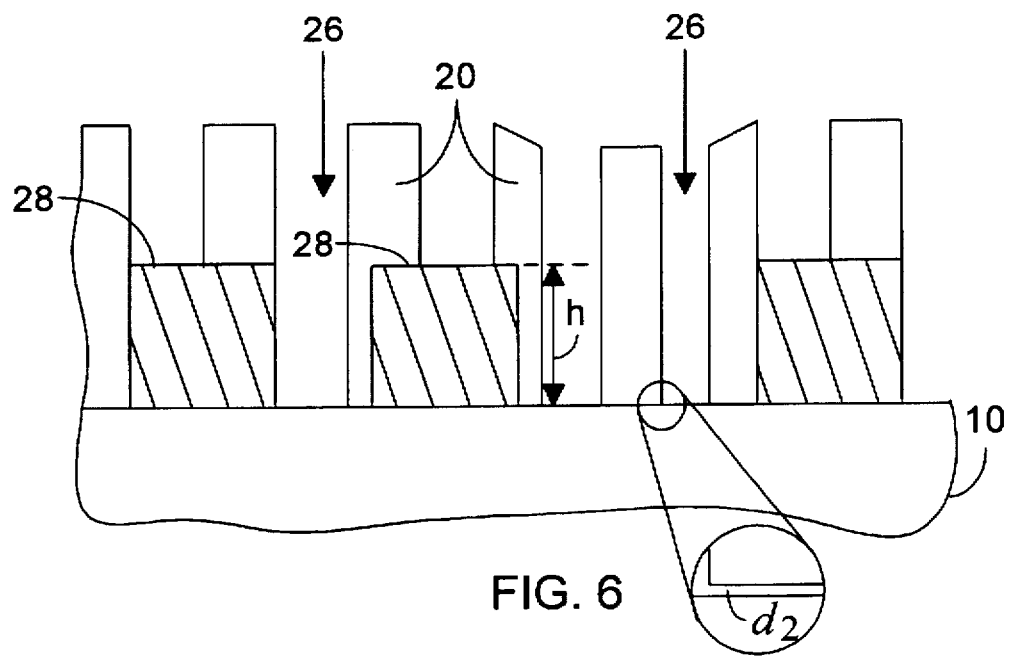
FIG. 6 is a processing step subsequent to that shown in FIG. 4, wherein portions of the second layer of dielectric have been removed at spaced intervals across the first dielectric to form high aspect ratio trenches wherein the trench depth extends below the upper surface of the first interconnect a/c to another exemplary embodiment.
Figure 7:
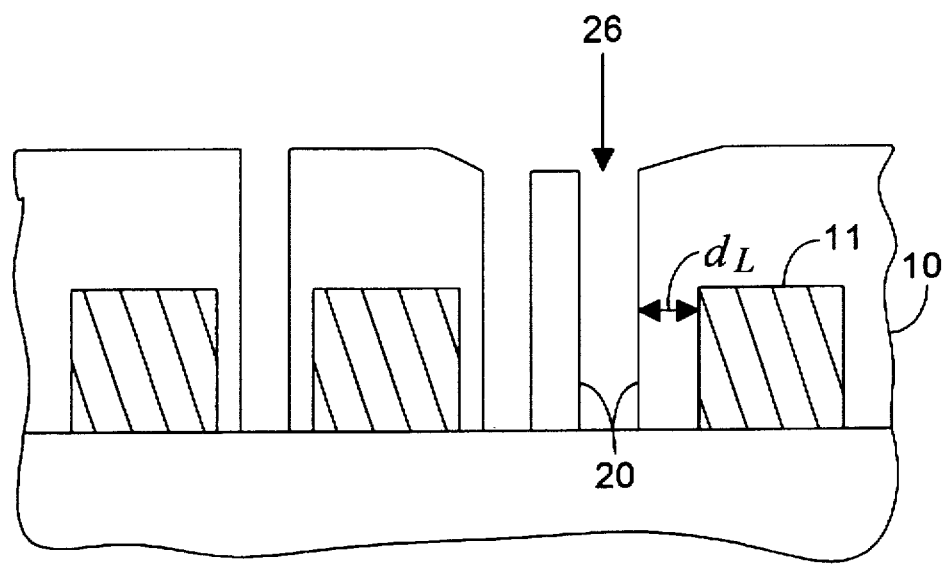
FIG. 7 is a processing step subsequent to that shown in FIG. 4, wherein portions of the second layer of dielectric have been removed at spaced intervals across the first dielectric to form high aspect ratio trenches wherein the trench depth extends below the upper surface of the first interconnect and wherein the trenches are laterally displaced from the first interconnect conductors a/c to yet another exemplary embodiment.

FIG. 5–7 depict alternative embodiments of a method for forming an interlevel dielectric. In each embodiment, portions of first dielectric 20 are removed to form air gap trenches 26 in first dielectric 20. Trenches 26 are preferably formed at spaced intervals across first dielectric 20 through the use of a masking step and a plasma etch. Trenches 26 are preferably formed to have aspect ratios preferably greater than 2.0. In the embodiment shown in FIG. 5, removal of first dielectric portions is accomplished such that the bottom 27 of said trenches are displaced from the semiconductor topography 10 by a distance $d_1$ that is greater than the vertical dimension h of the first interconnect lines 11. In this embodiment, trenches 26 do not extend between first interconnect lines 11 and, therefore, the intralevel permittivity may not be substantially altered. This embodiment may, however, provide a more controllable and predictable value of the interlevel permittivity because the patterning of the trench need not be performed relative to underlying first conductor location. In other words, because trenches 26 will be located at regular intervals regardless of the first conductor layout, the variations in interlevel permittivity across the device should be minimized.

In the embodiment shown in FIG. 6, the depth of trenches 26 is extended such that the distance $d_2$ between trench bottoms 27 and semiconductor topography 10 approaches zero. For all embodiments in which $d_2$ is less than the height h of interconnect lines 11, it can be seen that trenches 26 extend between interconnect lines 11 and thereby substantially alter intralevel permittivity. As shown in the drawing, trenches 26 are placed indiscriminately with respect to first interconnect lines 11. The combination of indiscriminate trench placement and deep (i.e. $d_2<h$) trench formation results in regions 28 where interconnect lines 11 are exposed during the formation of trenches 26. Therefore, interconnect lines 11 must be resistant to the process that removes dielectric 20 during the formation of trenches 26. In an embodiment in which trenches 26 are formed with a plasma etch of first dielectric 20, the etch process employed must have a high dielectric:interconnect selectivity. FIG. 7 displays an embodiment in which deep trenches 26 are laterally displaced from interconnect lines 11 by a minimum lateral displacement $d_L$ to prevent the exposure of interconnect lines 11 during the formation of trenches 26. This embodiment could increase the time required to generate and verify the trench mask because attention must be paid to where the trenches are located in relation to the first conductors.

Figure 8:
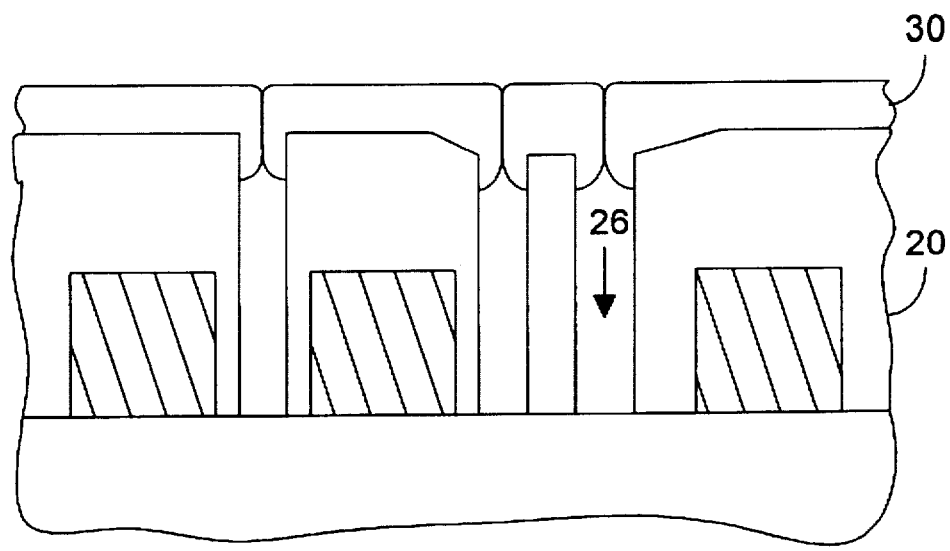
FIG. 8 is a processing step subsequent to that shown in FIG. 7, wherein a capping dielectric has been formed on the first dielectric.
Figure 9:
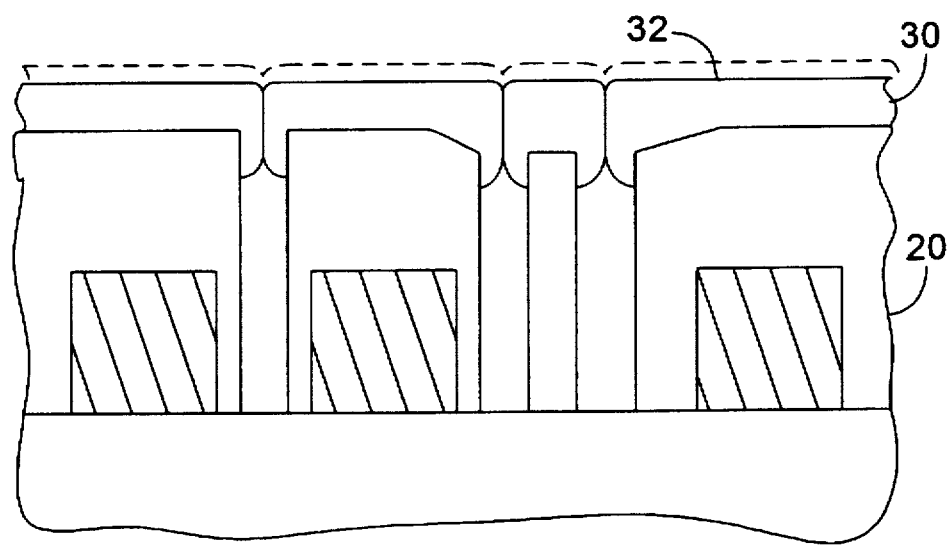
FIG. 9 is an optional processing step subsequent to that shown in FIG. 8, wherein a planarization of the capping dielectric is performed.

Turning now to FIG. 8, a capping dielectric 30 is formed upon first dielectric 20. Preferably, capping dielectric 30 comprises a layer of silicon dioxide formed from a silane source in a low temperature, atmospheric pressure CVD reactor. Low temperature, atmospheric or slightly below atmospheric pressure deposition of a silane based oxide coupled with the high (i.e. greater than 2.0) aspect ratio of trenches 26 results in cusping that will serve to seal off the upper portion of trenches 26 without filling the trenches 26 with dielectric material. Capping dielectric 30 provides a cap for trenches 26 such that subsequent deposition of an interconnect will not produce interconnect material in trenches 26. FIG. 9 shows an alternative embodiment of incorporating a capping dielectric 30 to produce substantially upper surface 32. Capping dielectric 30 forms air gaps as the material cusps when it fills trenches 26. There may be more than one air gap between conductors 11 depending upon the number of trenches formed in the space between conductors 11 and the relative amount of space areas. Accordingly, the number of air gaps is customizeable to the spacing area and the pre-existing trenches. Planarization of capping dielectric can be accomplished by a variety of planarization techniques including chemical mechanical polishing and sacrificial resist etchback. Alternatively, in an embodiment not shown, planarization could be preceeded by the deposition of an additional dielectric layer, preferably a CVD oxide formed from a TEOS or ozone ($O_3$) source. Such an embodiment might result in a more planar upper surface of second dielectric 30.

Figure 10:
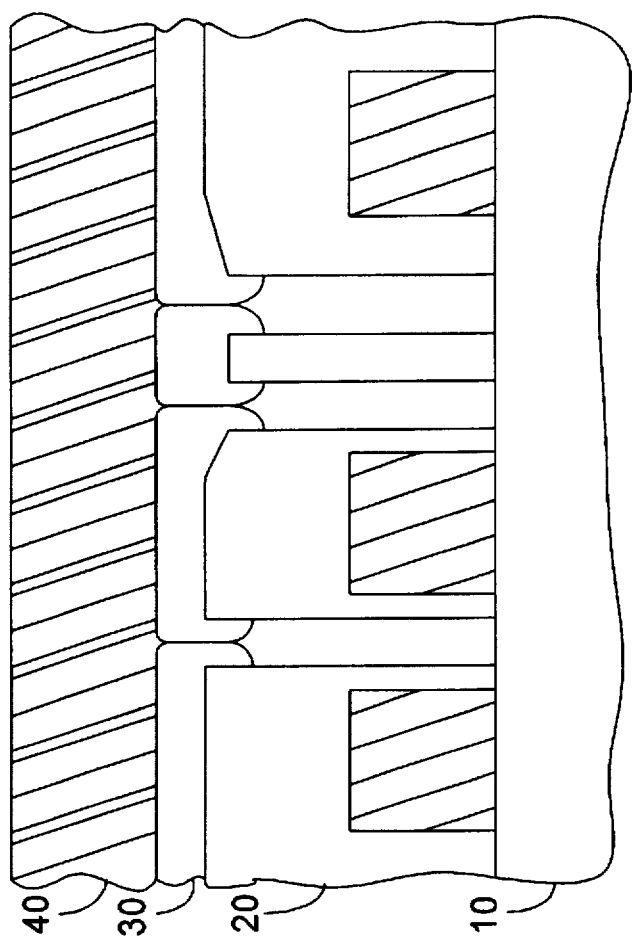
FIG. 10 is a processing step subsequent to that shown in FIG. 8 or 9, wherein a second interconnect level has been formed on the upper surface of the capping dielectric.
Figure 11:
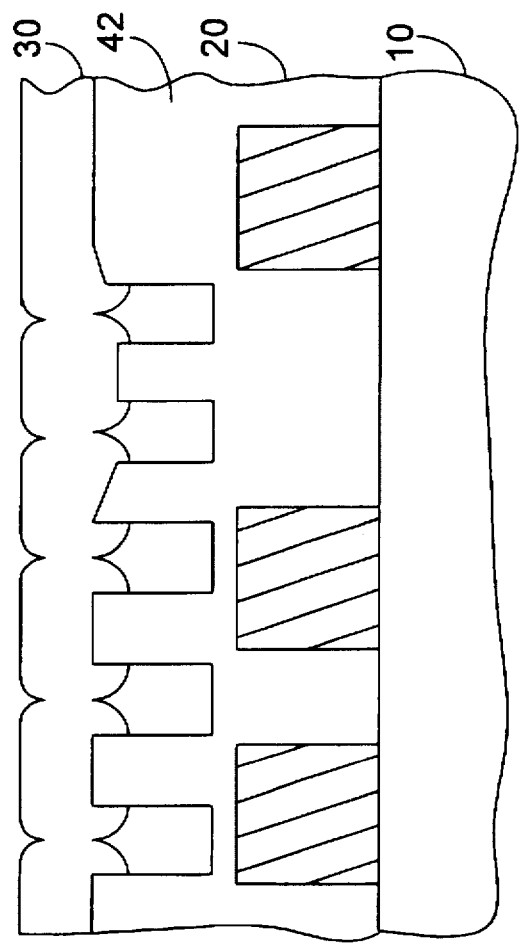
FIG. 11 is a partial cross section of an alternative embodiment of the first dielectric wherein trenches are purposefully not formed where a subsequent interlevel contact will be formed.

FIG. 10 shows a subsequent process step in which a second interconnect 40 has been formed on capping dielectric 30. Second interconnect 40 is preferably formed from an aluminum source in a physical vapor deposition step. FIG. 11 depicts an embodiment, prior to formation of second interconnect 40, in which the formation of trenches 26 is suppressed in regions 42 of first dielectric 20 where an interlevel contact will subsequently be located. Generation of a mask in which trenches are suppressed in the vicinity of inter level contacts is accomplished by "exclusive-or-ing" the trench mask with the contact mask using, for example, a 2.0 µm design rule.

Figure 12:
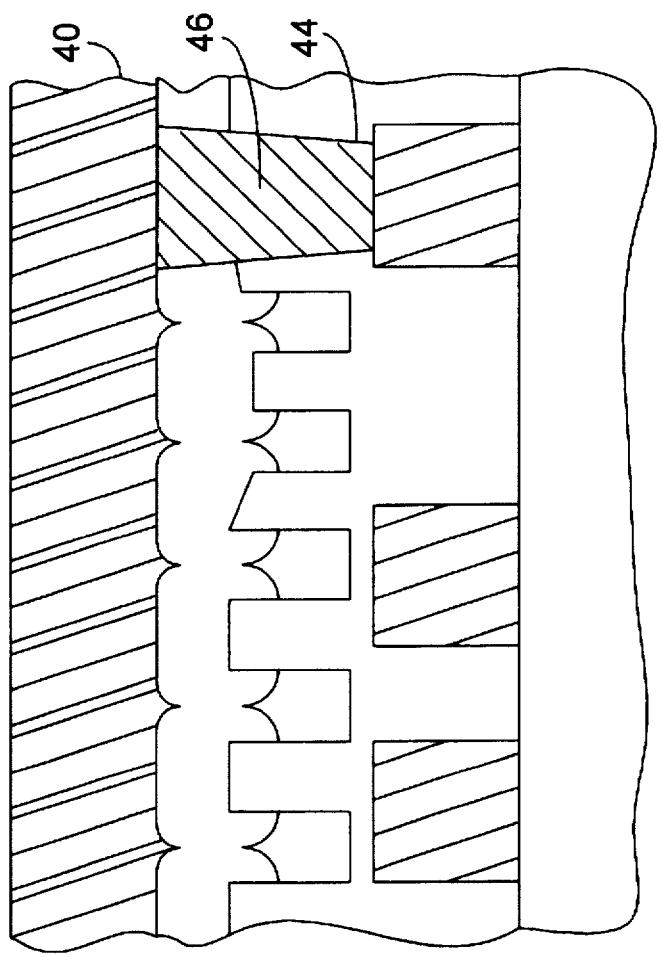
FIG. 12 is a processing step subsequent to that shown in FIG. 11 in which a contact to the first interconnect has been formed and filled with a conductive plug, and a second interconnect has been formed upon the contact.

FIG. 12 shows a process step subsequent to FIG. 11 in which contact 44 has been opened through first dielectric 20 and capping dielectric 30 over at least one of first conductors 11. Contact 44 is preferably formed using a plasma etch process with a fluorocarbon plasma. Contact 44 is then filled with conductive plug 46. Plug 46 is preferably formed in a CVD reactor from a tungsten source gas such as tungsten hexafluoride ($WF_6$). Deep, narrow contacts with substantially vertical sidewalls are common in semiconductor devices utilizing multiple interconnect levels. When such structures are present, it is difficult to deposit an interconnect level having adequate step coverage over the vias using a physical vapor deposition or sputter technique. Plug 46 is employed to overcome the step coverage limitations of sputtered films. In one embodiment, an adhesion layer (not shown in the drawing), preferably comprised of a greater than 100 but less than 1000 angstrom TiN film, is deposited to combat tungsten's poor adhesion to dielectrics such as $SiO_2$. Conformal tungsten is then deposited in a CVD reactor to fill contact 30. Excess tungsten is etched back or removed preferably with a chemical mechanical polish before second interconnect layer 40 is deposited.

The processing sequence beginning with FIG. 1 and concluding with FIG. 12 can be repeated subsequent to FIG. 12, wherein second interconnect layer 40 suffices as first conductor 12, and wherein a first dielectric layer 20 can be deposited upon second interconnect layer 40. Accordingly, the processing steps shown in FIGS. 1–12 are but two levels of possibly numerous levels of interconnect which can be formed. The exemplary embodiments shown are therefore merely exemplary of a single form of numerous forms, all of this would be obvious to a person skilled in the art having the benefit of this disclosure. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A method for forming two levels of interconnect upon a semiconductor topography, comprising:

depositing a first layer of metal upon the semiconductor topography;

removing portions of said first layer of metal to form a spaced set of first conductors;

forming a first dielectric upon and between said first conductors;

substantially planarizing an upper surface of said first dielectric;

removing portions of said first dielectric at spaced intervals across said first dielectric to form trenches, wherein at least a portion of said trenches are formed a spaced distance from said first conductors; and forming a second dielectric upon said first dielectric and a second conductor upon said second dielectric.

2. The method as recited in claim 1, wherein the step of forming said first dielectric comprises depositing $SiO_2$ from a TEOS source in a plasma enhanced chemical vapor deposition chamber maintained at approximately 375° C.

3. The method as recited in claim 1, wherein the step of forming said second dielectric comprises depositing $SiO_2$ from a silane source in a chemical vapor deposition chamber maintained approximately at atmospheric pressure or below atmospheric pressure.

4. The method as recited in claim 1, wherein the step of removing portions of said first dielectric comprises selectively etching said first dielectric to a first distance from the semiconductor topography.

5. The method as recited in claim 4, wherein said first distance is greater than a height of said first layer of interconnect.

6. The method as recited in claim 1, wherein the step of removing portions of said first dielectric comprises selectively etching said first dielectric to the semiconductor topography.

7. The method as recited in claim 6, wherein said trenches are laterally displaced from said first conductors.

8. The method as recited in claim 1, further comprising forming contact openings through said first and second dielectrics to at least one of said first conductors.

9. The method as recited in claim 8, wherein said contact openings are spaced from the removed portions of said first dielectric.

10. The method as recited in claim 1, wherein said spaced set of first conductors comprise one level of interconnect, and wherein portions of the second conductor comprise another level of interconnect.

11. An interlevel dielectric structure, comprising:

a plurality of trenches spaced from each other across a first dielectric configured upon and between a set of substantially coplanar first conductors, wherein at least a portion of said trenches are spaced from said first conductors;

a second dielectric arranged over said trenches; and a set of substantially coplanar second conductors formed upon said second dielectric.

12. The interlevel dielectric as recited in claim 11, further comprising a contact formed through said first and second dielectrics.

13. The interlevel dielectric as recited in claim 12, wherein said contact is configured a spaced distance from said trenches.

14. The interlevel dielectric as recited in claim 11, wherein each of said trenches comprise a depth less than the thickness of said first dielectric.

15. The interlevel dielectric as recited in claim 11, wherein each of said trenches comprise a depth substantially equal to the thickness of said second dielectric.

16. A method for forming an interlevel dielectric structure, comprising:

depositing a dielectric upon a set of first conductors arranged within a first elevation level;

forming trenches within said dielectric a spaced distance apart such that at least a portion of said trenches are formed a distance from said first conductors;

depositing a capping dielectric upon said trenches to cover said trenches and retain a region void of dielectric; and forming a set of second conductors upon said capping dielectric.

17. The method as recited in claim 16, wherein said set of first conductors and said set of second conductors each comprise a level of interconnect patterned across a semiconductor wafer.

18. The method as recited in claim 17, wherein said region void of dielectric extends the thickness of said dielectric.

19. The method as recited in claim 1, wherein said spaced intervals are equal.

20. The method as recited in claim 11, wherein said plurality of trenches are spaced an equal distance apart.

* * * * *